United States Patent
Zheng et al.

(10) Patent No.: US 10,475,968 B1
(45) Date of Patent: Nov. 12, 2019

(54) OPTOELECTRONIC COMPONENT AND A METHOD FOR PRODUCING AN OPTOELECTRONIC COMPONENT

(71) Applicant: OSRAM Opto Semiconductors GmbH, Regensburg (DE)

(72) Inventors: Yi Zheng, Lynnfield, MA (US); Victor Perez, Lawrence, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/039,556

(22) Filed: Jul. 19, 2018

(51) Int. Cl.
    *H01L 33/00* (2010.01)
    *H01L 33/50* (2010.01)
    *H01L 33/26* (2010.01)
    *H01L 25/16* (2006.01)

(52) U.S. Cl.
    CPC .......... *H01L 33/502* (2013.01); *H01L 25/167* (2013.01); *H01L 33/26* (2013.01)

(58) Field of Classification Search
    CPC ...... H01L 33/502; H01L 33/26; H01L 25/167
    USPC .......................................................... 257/98
    See application file for complete search history.

(56) References Cited

U.S. PATENT DOCUMENTS

| | | | |
|---|---|---|---|
| 2013/0207151 A1 | 8/2013 | Eberhardt et al. | |
| 2013/0257264 A1* | 10/2013 | Tamaki | B05D 5/06 313/503 |
| 2019/0241805 A1 | 8/2019 | Ando | |

FOREIGN PATENT DOCUMENTS

| | | |
|---|---|---|
| WO | 2016209871 A1 | 12/2016 |
| WO | 2018092644 A1 | 5/2018 |

OTHER PUBLICATIONS

Chen, Li-Yin, et al., "Novel broadband glass phosphors for high CRI WLEDs", Optics Express, vol. 22, No. S3, May 5, 2014, 8 pages.
Lin, Zebin, et al., "A chromaticity-tunable garnet-based phosphor-in-glass color converter applicable in w-LED", Journal of the European Ceramic Society 36, 2016, pp. 1723-1729.
Fujita, Naoki, et al., "Wavelength Conversion Material "Phosphor-Glass Composites" for High Power Solid-State Lighting", PHp-15, IDW '13, 2013, pp. 775-778.
Li, Hong, et al., "Preparation and luminescent properties of the coating of phosphor in lead-free glass by multilayer screen-printing", Journal of Alloys and Compounds, vol. 684, Nov. 5, 2016, pp. 372-378.

\* cited by examiner

*Primary Examiner* — Tu-tu V Ho
(74) *Attorney, Agent, or Firm* — Slater Matsil, LLP

(57) ABSTRACT

In one embodiment, an optoelectronic component includes a semiconductor chip, which is able to emit radiation. A conversion element comprises at least one wavelength converting phosphor dispersed in a matrix material. The matrix material is a low-melting phosphate glass and water resistant. The optoelectronic component emits in operation warm white light.

20 Claims, 5 Drawing Sheets

| S | G | P | SID | D | Cx | Cy | CE (lm/W) | SPS (°C/m/MPa) |
|---|---|---|---|---|---|---|---|---|
| | TMS-476 | L186/BR101A (3.75:1), 35wt% | S1436 | 123 | 0.4093 | 0.3702 | 69.7 | 290/0/15 |
| | | | S1436 | BW | 0.4380 | 0.4003 | 58.5 | |

| | G | P | SID | D | Cx | Cy | CE (lm/W) | SPS (°C/m/MPa) |
|---|---|---|---|---|---|---|---|---|
| | EG2760, Pb-B-Zn | L186/BR101A (3.75:1), 35wt% | S1443 | 113 | 0.4462 | 0.3980 | 57.7 | 250/0/50 |
| | | | S1443 | BW | 0.4820 | 0.4009 | 39.4 | |

| PIGs ID | G | P | SID | D | Cx | Cy | CE (lm/W) | SPS (°C/m/MPa) |
|---|---|---|---|---|---|---|---|---|
| #55 | 01-4102p | L186/BR101A (3.75:1), 35wt% | S1509 | 107 | 0.3836 | 0.3366 | 71.9 | 300/0/50 |
| | | | S1509 | BW | 0.3905 | 0.3472 | 78.8 | |

| | G | P | SID | D | Cx | Cy | CE (lm/W) | SPS (°C/m/MPa) |
|---|---|---|---|---|---|---|---|---|
| | 01-4102p | L186/BR101A (4:1), 35wt% | S1545 | 122 | 0.3687 | 0.3239 | 81.5 | 300/0/50 |
| | | | S1545 | BW | 0.3733 | 0.3318 | 83.9 | |

FIG 6B

OPTOELECTRONIC COMPONENT AND A METHOD FOR PRODUCING AN OPTOELECTRONIC COMPONENT

TECHNICAL FIELD

The invention relates to an optoelectronic component. The invention further relates to a method for producing an optoelectronic component.

BACKGROUND

In the conventional optoelectronic component, for example in conventional phosphor conversion warm white LEDs, the used phosphors are generally mixtures of yellow emitting and red emitting phosphors. The phosphor mixtures are mixed with a polymer material, such as silicon or epoxy. The phosphor mixtures are cast, deposited or coated on a blue excitation source chip in LED packages. The phosphor mixture adsorbs at least a part of the blue light from the chip and converts it to yellow and red light, creating a warm white light. The phosphor polymer mixture approach is easy to apply to LED packages and relatively less expensive. However the polymer materials are instable and degrade under high temperature and high light intensity.

There are also attempts to use glass to replace polymer matrix materials to overcome stability problems, such as examples of phosphor-in-glasses (PiGs). Most phosphor-in-glasses approaches are made when the glass softens or melts, to assure homogeneity of phosphor dispersion in glass and get rid of the majority of pores in it. On the current market there are cool white PiG LEDs available which use single yellow YAG:Ce phosphor. YAG:Ce is an oxide phosphor. It is relatively resistant to damage from glasses which are normally a mixture of different oxides. However, there are no warm white PiG LEDs on the market. This is related to phosphors used in the warm white LEDs. In addition to yellow YAG:Ce phosphor, a red phosphor is also needed. The most common red phosphors are nitride phosphors, such as $(Ca, Sr, Ba)_2Si_5N_8$:Eu and $CaAlSiN_3$:Eu phosphors. These nitride phosphors are very easily damaged by oxide from the glasses because the nitride phosphors are very sensitive to oxygen impurity. $SiO_2$-$Na_2O$-$Al_2O_3$-CaO glass was used to contain red nitride phosphors ("Novel broadband glass phosphors for high CRI WLEDs" Optics Express, Vol. 22, Issue S3, pp. A671-A678 (2014)). Since the $SiO_2$-$Na_2O$-$Al_2O_3$-CaO glass has to melt or soften at above 680° C., the red nitride PiGs made from this glass have a very low efficiency, which is indicated by means of damage to the glass. The degree of damage increases as the processing temperature increases.

It is important to reduce the processing temperature to avoid or mitigate damage to red nitride phosphors. Thus choosing glasses that melt or soften at low temperature is important. It is normally desirable to keep the processing temperature below 400° C. when processing nitride phosphor-in-glass. However, the low melting temperature glasses are normally not water-resistant which is a must-have requirement for conversion materials if they are used in LEDs or optoelectronic components. The difficulty in finding a suitable low-melting glass with good water resistance is a major technical challenge in making warm white conversion elements.

SUMMARY

Embodiments of the invention provide an optoelectronic component which can overcome the above-mentioned disadvantages. Embodiments of the invention also provide a method for producing an optoelectronic component, which can overcome the above-mentioned disadvantages.

In one embodiment, an optoelectronic component includes a semiconductor chip, which is able to emit radiation. A conversion element comprises at least one wavelength converting phosphor dispersed in a matrix material. The matrix material is a low-melting phosphate glass and water resistant. The optoelectronic component emits in operation warm white light.

The following list of reference numbers can be used with reference to the drawings:

100 optoelectronic component
1 semiconductor chip
2 conversion element
3 yellow-emitting phosphor
4 red-emitting phosphor
5 matrix material
6 housing

DETAILED DESCRIPTION OF ILLUSTRATIVE EMBODIMENTS

In at least one embodiment the optoelectronic component comprises a semiconductor chip. The semiconductor chip is able to emit radiation, in particular in operation. The optoelectronic component comprises a conversion element. The conversion element comprises at least one wavelength converting phosphor or exactly one wavelength converting phosphor or two wavelength converting phosphors. The at least one phosphor is dispersed in a matrix material. The matrix material is a low-melting phosphate glass. The matrix material is water-resistant. The optoelectronic component emits warm white light in operation.

It should be pointed out that the term "optoelectronic component" requires not or relates not only to finished components, such as, for example, light-emitting diodes (LEDs) or laser diodes, but also to substrates and/or semiconductor layers, such that, for example, a composite of a copper layer and a semiconductor layer already forms a component and can form part of a superordinate second component, in which, for example, electrical connections are additionally present.

The optoelectronic component according to the invention can be, for example, a thin-film semiconductor chip, in particular a thin-film light-emitting diode chip.

According to one embodiment the optoelectronic component comprises a semiconductor chip. The semiconductor chip can have a semiconductor layer sequence. The semiconductor layer sequence of the semiconductor chip is preferably based on a III-V compound semiconductor material. For example, this includes compounds from the elements consisting of indium, gallium, aluminum, nitrogen, phosphorus, arsenic, oxygen, silicon, carbon and combinations thereof.

However, other elements and additions can also be used. The semiconductor layer sequence having an active region can be based, for example, on nitride compound semiconductor materials. In the present context, "based on nitride compound semiconductor material" means characterized in that the semiconductor layer sequence or at least a part thereof is a nitride compound semiconductor material, preferably $AlnGamIn_{1-n-m}N$, or consists thereof, wherein $0 \leq n \leq 1$, $0 \leq m \leq 1$ and $n+m \leq 1$. This material does not necessarily have a mathematically exact composition according to the above formula. Rather, it can have, for example, one or more dopants and additional constituents. For the sake of simplicity, however, the above formula only contains the essential constituents of the crystal lattice (Al, Ga, In, N), even if these can be partially replaced and/or supplemented by small quantities of further substances.

The semiconductor layer sequence comprises an active layer having at least one pn-junction and/or having one or more quantum well structures. During operation of the LED or of the semiconductor chip, an electromagnetic radiation is generated in the active layer. A wavelength or a wavelength maximum of the radiation is preferably in the blue and/or ultraviolet and/or visible and/or infrared spectral range, in particular at wavelengths between 420 and 800 nm inclusive, for example between 440 and 480 nm inclusive.

According to one embodiment the semiconductor chip emits in operation radiation having a wavelength range of 400 nm to 490 nm or a wavelength maximum in this range.

According to at least one embodiment the optoelectronic component is embodied as an inorganic or organic light-emitting diode, LED or OLED for short. In particular the LED or OLED emits in operation warm white light. This can mean that the light has a correlated color temperature (CCT) in the range of 2000-3500K.

According to one embodiment the correlated color temperature (CCT) is in the range of 1500 K to 3500 K, for example 3500 K with a tolerance in the range of 0, 1, 2, 3, 5 or 10% of this value.

According to one embodiment the optoelectronic component comprises a conversion element. In particular the conversion element is arranged in the beam path of radiation of the semiconductor chip. The conversion element can be arranged on the main surface of the semiconductor chip. Alternatively, the conversion element can be embodied as a cast or as a plate.

Here and in the following "plate" means that the conversion element is embodied separately from the semiconductor chip and is in a so-called pick-and-place process applied on the main surface of the semiconductor chip. The conversion element can be applied on the main surface of the semiconductor chip and on the side surface of the semiconductor chip. "Main surface of the semiconductor chip" here means the main radiation exit area of the semiconductor chip.

According to one embodiment the conversion element comprises at least one wavelength converting phosphor, phosphor for short, which is dispersed in a matrix material. The matrix material is a low-melting phosphate glass and is water-resistant. The phosphor can be dispersed homogeneously in the matrix material. Alternatively the phosphor can be dispersed with a concentration gradient in the matrix material. For example the concentration of the phosphor in the conversion element can be higher in the vicinity of the semiconductor chip than the concentration of the phosphor which is arranged facing away from the main surface of the semiconductor chip.

According to one embodiment the conversion element comprises at least one phosphor, exactly one phosphor, two phosphors or lots of phosphors.

The at least one phosphor can be selected from the group consisting of $(RE_{1-x}Ce_x)_3(Al_{1-y}A'_y)_5O_{12}$ with $0 < x \leq 0.1$ and $0 \leq y \leq 1$, $(RE_{1-x}Ce_x)_3(Al_{5-2y}Mg_ySi_y)O_{12}$ with $0 < x \leq 0.1$ and $0 \leq y \leq 2$, $(RE_{1-x}Ce_x)_3Al_{5-y}Si_yO_{12-y}N_y$ with $0 < x \leq 0.1$ and $0 \leq y \leq 0.5$, $(RE_{1-x}Ce_x)_2CaMg_2Si_3O_{12}:Ce_{3+}$ with $0 < x \leq 0.1$, $(AE_{1-x}Eu_x)_2Si_5N_8$ with $0 < x \leq 0.1$, $(AE_{1-x}Eu_x)AlSiN_3$ with $0 < x \leq 0.1$, $(AE_{1-x}Eu_x)_2Al_2Si_2N_6$ with $0 < x \leq 0.1$, $(Sr_{1-x}Eu_x)LiAl_3N_4$ with $0 < x \leq 0.1$, $(AE_{1-x}Eu_x)_3Ga_3N_5$ with $0 < x \leq 0.1$, $(AE_{1-x}Eu_x)Si_2O_2N_2$ with $0 < x \leq 0.1$, $(AE_xEu_y)Si_{12-2x-3y}Al_{2x+3y}O_yN_{16-y}$ with $0.2 \leq x \leq 2.2$ and $0 < y \leq 0.1$, $(AE_{1-x}Eu_x)_2SiO_4$ with $0 < x \leq 0.1$, $(AE_{1-x}Eu_x)_3Si_2O_5$ with $0 < x \leq 0.1$, $K_2(Si_{1-x-y}Ti_yMn_x)F_6$ with $0 < x \leq 0.2$ and $0 < y \leq 1-x$, $(AE_{1-x}EU_x)_5(PO_4)_3Cl$ with $0 < x \leq 0.2$, $(AE_{1-x}Eu_x)Al_{10}O_{17}$ with $0 < x \leq 0.2$ and combinations thereof, wherein RE is one or more of Y, Lu, Tb and Gd; AE is one or more of Mg, Ca, Sr, Ba; A' is one or more of Sc and Ga; wherein the phosphors optionally include one or more of halides.

The at least one phosphor can be a luminescent material or a luminescent material mixture comprising at least one of the following luminescent materials:

$Eu_{2+}$-doped nitrides such as $(Ca,Sr)AlSiN_3$: $Eu_{2+}$, $Sr(Ca,Sr)Si_2Al_2N_6:Eu_{2+}$, $(Sr,Ca)AlSiN_3*Si_2N_2O:Eu_{2+}$, $(Ca,Ba,Sr)_2Si_5N_8:Eu_{2+}$, $(Sr,Ca)[LiAl_3N_4]:Eu_{2+}$;

garnets from the general system $(Gd,Lu,Tb,Y)_3(Al,Ga,D)_5(O,X)_{12}:RE$ with X=halide, N or divalent element, D=tri- or tetravalent element and RE=rare earth metals such as $Lu_3(Al_{1-x}Ga_x)_5O_{12}:Ce_{3+}$, $Y_3(Al_{1-x}Ga_x)_5O_{12}:Ce_{3+}$;

$Eu_{2+}$-doped sulfides such as $(Ca,Sr,Ba)S:Eu_{2+}$;

$Eu_{2+}$-doped SiONs such as $(Ba,Sr,Ca)Si_2O_2N_2:Eu_{2+}$;

SiAlONs for instance from the system $Li_xM_yLn_zSi_{12-(m+n)}Al(m+n)O_nN_{16-n}$;

beta-SiAlONs from the system $Si_{6-x}Al_zO_yN_{8-y}:REz$;

nitrido-orthosilicates such as $AE_{2-x-a}RE_xEu_aSiO_4-xN_x$, $AE_{2-x-a}RE_xEu_aSi_{1-y}O_{4-x-2y}N_x$ with RE=rare earth metal and AE=alkaline earth metal;

orthosilicates such as $(Ba,Sr,Ca,Mg)_2SiO_4:Eu_{2+}$; chlorosilicates such as $Ca_8Mg(SiO_4)_4Cl_2:Eu_{2+}$;

chlorophosphates such as $(Sr,Ba,Ca,Mg)_{10}(PO_4)_6Cl_2:Eu_{2+}$;

BAM luminescent materials from the $BaO—MgO-Al_2O_3$ system such as $BaMgAl_{10}O_{17}:Eu_{2+}$;

halophosphates such as $M_5(PO_4)_3(Cl,F):(Eu_2+,Sb_3+, Mn_2+)$;

SCAP luminescent materials such as $(Sr,Ba,Ca)_5(PO_4)_3 Cl:Eu_2+$.

Moreover "Quantum dots" may also be introduced as converter material. Quantum dots in the form of nanocrystalline materials which contain a group II-VI compound and/or a group III-V compound and/or a group IV-VI compound and/or metal nanocrystals, are preferred in this case.

According to one embodiment the conversion element comprises two phosphors, a green and/or yellow-emitting phosphor and a red-emitting phosphor.

Green and/or yellow-emitting phosphor means herein and in the following that the phosphor emits radiation in the dominant wavelength range of 550 nm to 590 nm.

Red-emitting phosphor means herein and in the following that the phosphor emits in operation radiation with a dominant wavelength range maximum of 590 nm to 750 nm.

According to one embodiment the yellow-emitting phosphor is selected from the group consisting of LuAG:Ce, YAG:Ce, β-SiAlON:Eu and SrSiON:Eu.

According to one embodiment the red-emitting phosphor is selected from the group consisting of $CaAlSiN_3$:Eu, (Ca, Sr, Ba)$_2Si_5N_8$:Eu, α-SiAlON:Eu and $K_2SiF_6:Mn_4+$.

According to one embodiment the conversion element comprises inorganic powder for adjusting the scattering property and/or thermal conductivity property of the conversion element. The inorganic powder can be embodied as nanoparticles. The nanoparticles can be oxides, for example $SiO_2$, $ZrO_2$, $TiO_2$, $Al_2O_3$, ZnO; nitrides for example AlN, $Si_3N_4$, BN, GaN; carbon-based nanoparticles, for example carbon nanotubes, graphene and their derivatives.

According to one embodiment the inorganic powder is selected from the group consisting of $TiO_2$, $ZrO_2$, $Al_2O_3$, AlN.

According to one embodiment the total content of the at least one phosphor in the conversion element is in the range of 25 wt % to 40 wt %, for example 30 wt %.

According to one embodiment the ratio of the yellow-emitting phosphor to the red-emitting phosphor is in the range of 3:1 to 5:1, for example 4:1 or 3.75:1.

According to one embodiment the CRI of the optoelectronic component is more than 90, for example 91.

According to one embodiment the conversion element is free of silicon and/or epoxy. In particular the conversion element comprises a matrix material. The matrix material is made of a low-melting phosphate glass. The low-melting phosphate glass is water-resistant. This can mean here that if the material is exposed to water or a water-containing environment, the appearance of the material does not change, the material does not dissolve and has no or very small weight loss.

According to one embodiment the low-melting phosphate glass comprises the following materials or consists thereof: $P_2O_5$, $Al_2O_3$, $B_2O_3$, $Na_2O$, $K_2O$ and F. The commercial glass 01-4102p provided by Tomatec can be used.

Alternatively other low-melting temperature phosphate glasses with good water resistance can be used.

The inventors have recognized that the use of a low-melting temperature glass in the conversion element with good water resistance leads to a warm white optoelectronic component.

The advantages of employing the invention are firstly, making inorganic warm white phosphor conversion with good efficiency (no or little damage to red nitride phosphor), secondly it is more resistant to high temperature and high excitation light intensity than its predecessor phosphor-in-polymer, thirdly it has higher thermal conductivity than phosphor-in-polymer and is better to dissipate the heat in the LED packages.

According to one embodiment the conversion element is producible by a processing temperature below 400° C.

According to one embodiment the optoelectronic component comprises scattering and/or reflective particles.

The scattering particles can comprise, for example, a metal oxide such as aluminum oxide or titanium oxide. The reflective particles can be produced from a metal fluoride such as calcium fluoride or from a silicon oxide or consist thereof.

An average diameter of the scattering particles, for example a median diameter d50 in Qo, is preferably between 0.3 μm and 5 μm inclusive. A proportion by weight of the scattering particles on the entire casting material is preferably between 1% and 30% inclusive, in particular between 0.5% and 5% inclusive. The particles have a scattering effect on the basis of their preferably white color and/or on account of their refractive index difference to the matrix material.

The invention further relates to a method for producing an optoelectronic component. In particular the above-mentioned optoelectronic component is produced by the following method. In particular the definitions and exemplary embodiments mentioned for the optoelectronic component are also valid for the method for producing an optoelectronic component and vice versa.

The method for producing an optoelectronic component comprises the steps of

A) Applying a powdered matrix material, which is a low-melting phosphate glass and water resistant, B) Applying a powdered phosphor or more than one phosphor, which are able to convert radiation, C) Mixing the powdered matrix material and the at least one powdered phosphor, and D) Sintering the mixture of step C) by a maximum processing temperature of 400° C. under reduced or inert atmosphere.

According to one embodiment the reducing or inert atmosphere is a nitrogen atmosphere.

According to one embodiment the method is free of a solvent, in particular in step C).

According to one embodiment step D) is applied by a maximum pressure of 50 MPa.

According to one embodiment the processing temperature in step D) has a maximum of 300° C.

Further advantageous embodiments and developments will become apparent from the exemplary embodiments described below in conjunction with the figures.

In the exemplary embodiments and figures, identical or identically acting elements can in each case be provided with the same reference symbols. The elements illustrated and their size relationship to one another are not to be regarded as true to scale. Rather, individual elements such as, for example, layers, components, devices and regions can be represented with an exaggerated size for better representability and for a better understanding.

Figure 1A:
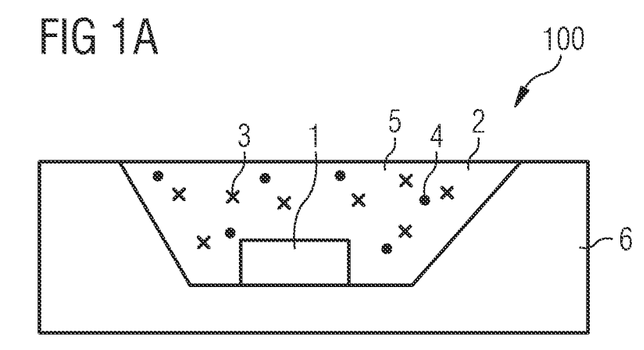
FIG. 1A shows a schematic illustration of an optoelectronic component according to an embodiment.

FIG. 1A shows a schematic illustration of an optoelectronic component 100 according to an embodiment. The optoelectronic component 100 comprises a housing 6. In the recess of the housing 6 a semiconductor chip 1 is applied. The semiconductor chip 1 is able to emit radiation, in particular to emit blue light. In the recess a conversion element 2 is applied. The conversion element 2 is embodied as a cast. The conversion element comprises two phosphors 3 and 4 and a matrix material 5 which is a low-melting phosphate glass. The two phosphors are a yellow-emitting phosphor and a red-emitting phosphor. The yellow-emitting phosphor 3 is for example YAG:Ce. The red-emitting phosphor 4 is for example $(Ca, Sr, Ba)_2Si_5N_8$:Eu. The optoelectronic component emits in operation warm white light.

Figure 1B:
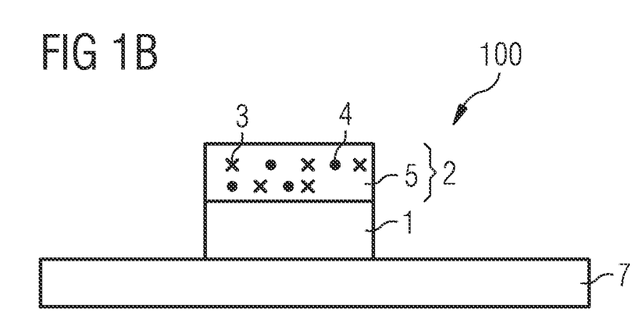
FIG. 1B shows a schematic illustration of an optoelectronic component according to an embodiment.

FIG. 1B shows a schematic illustration of an optoelectronic component 100 according to one embodiment. The optoelectronic component 100 comprises a substrate 7 on which a semiconductor chip 1 is applied. On the semiconductor chip 1, in particular on the main surface of the semiconductor chip, a conversion element 2 is applied. The conversion element 2 completely covers the main surface of the semiconductor chip 1. The side surfaces of the semiconductor chip 1 are free of the conversion element 2. The conversion element 2 is embodied as a plate. The plate is, in a so-called pick-and-place process, applied on the main surface of the semiconductor chip 1. The conversion element 2 comprises a red-emitting phosphor and a yellow-emitting phosphor 3 which are dispersed in a matrix material 5. The matrix material 5 is a low-melting phosphate glass.

The optoelectronic component 100 according to FIG. 1B is able to emit warm white light in operation.

The optoelectronic component can be produced as follows.

The matrix material, in particular the low-melting glass powder, the yellow-emitting phosphor and the red-emitting phosphor, each in a powder form, are weighted according to a certain ratio. Then they are mixed manually by an agate mortar and pestle. Then they are mixed in a plastic jar in a Thinky mixer ARE-500 at 1000 rpm for two minutes. About 0.8 g of mixed powder is put into a graphite die with 15 mm inner diameter. The samples are sintered by SPS Syntex Inc's Dr. Sinter Lab™ SPS machine, model SPS515 with the maximum force of 50 kN and a maximum current of 1500 A. The sample is sintered under an N2 atmosphere. The samples are sintered at peak temperature for a few minutes with a maximum pressure of 50 MPa.

In one warm white optoelectronic component example, the TMS-476 phosphate glass powder from Tomatec, Japan, is used. The yellow phosphor used is $Lu_3Al_5O_{12}$:Ce, for example LuAG:Ce $Li_{86}$ phosphor from OSRAM. The red phosphor is used is a Mitsubishi $CaAlSiN_3$:Eu Br101A phosphor. The weight ratio of yellow to red phosphor is 3-75:1 and the phosphor total rate percentage in the mixture is 35 wt %.

0.8 g of phosphor-in-glass mixtures are sintered at 290° C., with zero minute hold under maximum pressure of 50 MPa. The sintered components or discs are ground and thinned down to about 120 μm.

Figure 2A:
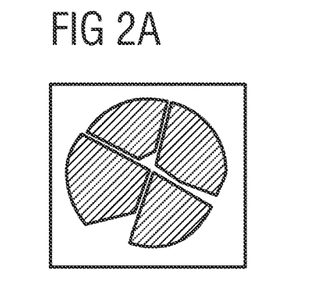
FIG. 2A shows an optoelectronic component according to one embodiment before the boiling water test.
Figure 2B:
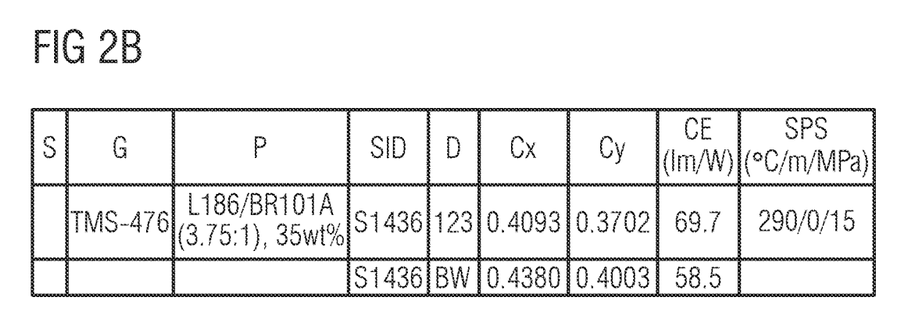
FIG. 2B shows the experimental data.
Figure 2C:
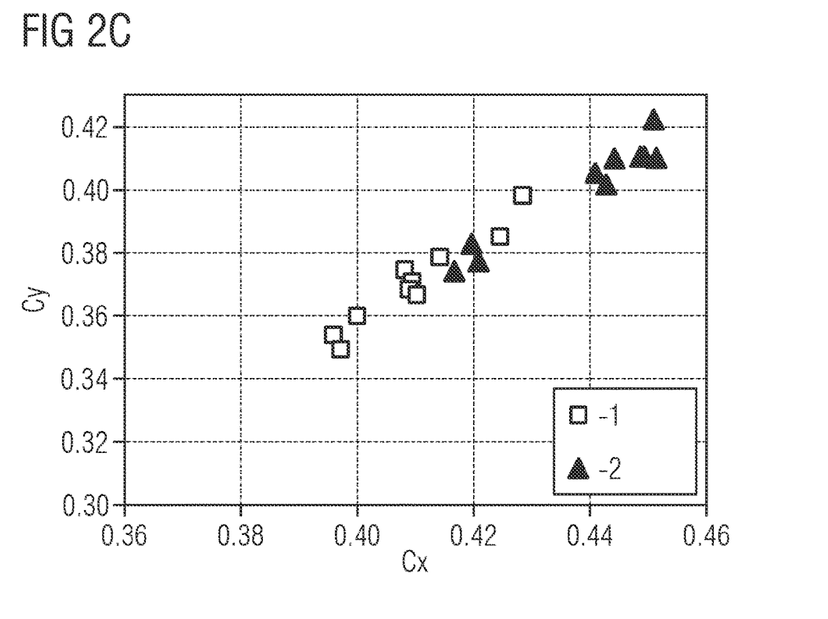
FIG. 2C shows the chromaticity diagram of an optoelectronic component according to an embodiment.

FIG. 2A shows the resulting optoelectronic components, here called a sample of S1436. The optoelectronic components or discs are measured with a tester for optical performance. The discs are placed on a platform with a 0.6 mm diameter pin hole, where a blue light with dominant wavelength 448 nm from a blue semiconductor chip is shone through. The transmitted light and converted light are measured to the top of the sample disc. The conversion efficiency CE is calculated by lumens divided by optical power from excitation blue semiconductor chip. The disc is immersed into boiling water for 30 minutes. This boiling water test is one of the accelerated water resistant tests. The disc before the boiling water test (FIG. 2A) is measured by the tester. The measurement results are listed in FIG. 2B with G—glass
P—phosphors
SID—sample ID
D—thickness
BW—Boiling water/30 m The measured colors Cx and Cy are shown in FIG. 2C (rectangle, 1—sample before boiling water test; triangle, 2—sample after boiling water test).

The warm white optoelectronic component (sample S1436) disc has a relatively high efficiency for a sintered sample with CE of 69.7 lm/W. The disc reaches a warm white color region, indicating that the red phosphor is not damaged or has very little damage. But after the boiling water test for 30 minutes, the disc emission color shifts to red with an average CX increase of 0.0287 and CE decreases to 58.5 lm/W, a 16% drop.

It is apparent that TMS-476 phosphate glass as a comparative embodiment has poor water resistance also at a temperature low enough to have no or little damage to red emitting phosphor.

Figure 3:
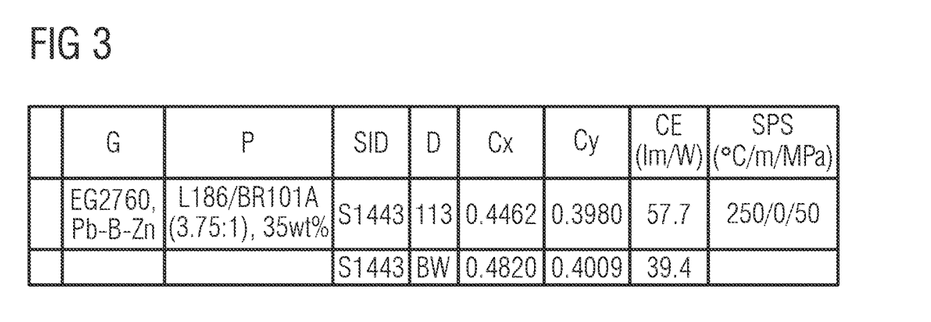
FIG. 3 shows the experimental data of an embodiment.

Another sample is, for example, S1443. This sample is made from Ferro $PbO-B_2O_3$-ZnO low melting temperature glass EG2760 as a comparative embodiment. The optoelectronic component is measured before and after a boiling water test. The experimental data are listed in FIG. 3. After the boiling water test the optoelectronic component color average CX increases by 0.0258, shifted toward red. The CE reduces by 32%. It shows that the EG2760 glass is also not water-resistant.

In another example, the 01-4102p phosphate glass powder from Tomatec, Japan is used. The yellow-emitting phosphor is LuAG:Ce $L_{186}$ from OSRAM. The red-emitting phosphor used is Mitsubishi $CaAlSiN_3$:Eu $BR_{101}A$. The weight ratio of the yellow-emitting phosphor to the red-emitting phosphor is 3.75:1, and the phosphor's total weight percentage in the mixture is 35%.

0.8 g of phosphor and glass mixtures are sintered at 300° C., with 0 minute under maximum pressure of 50 MPa. The sintered optoelectronic component or discs are ground and thinned down to about 120 μm.

Figure 4A:
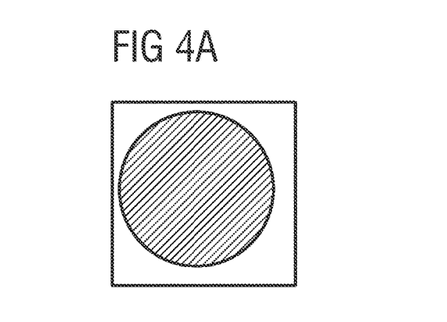
FIG. 4A shows an optoelectronic component before and after the boiling water test.

FIG. 4A shows the optoelectronic component before the boiling test.

Figure 4B:
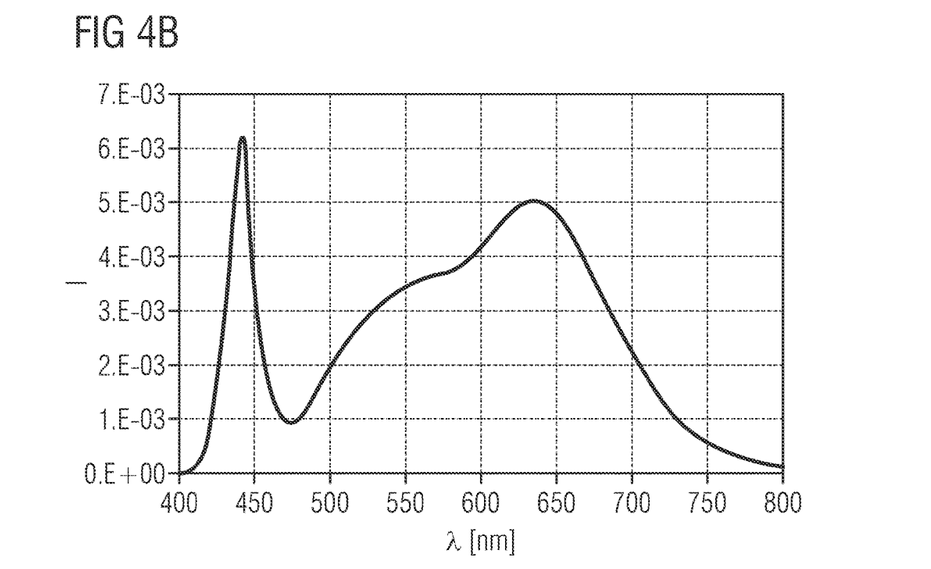
FIG. 4B shows a an emission spectrum of an embodiment.

FIG. 4B shows a typical spectrum of the inventive optoelectronic component excited by 448 nm with blue emitting semiconductor chip. It shows the intensity I as a function of the wavelength in nm. It has a color temperature near 3500 K and a CRE of 90.5, showing a high CRI (Color Rendering Index) warm white emission, is achieved.

Figure 5A:
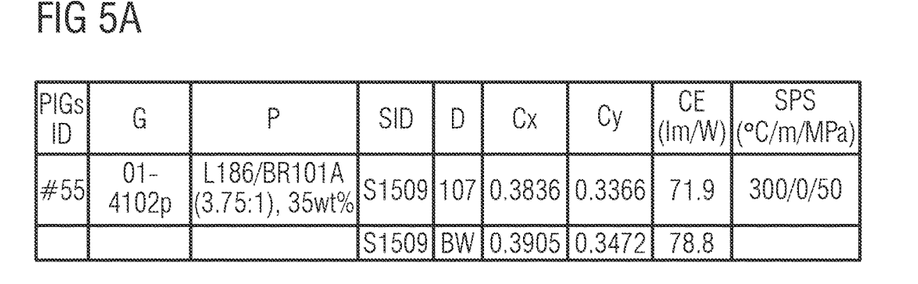
FIG. 5A shows experimental data of an embodiment.
Figure 5B:
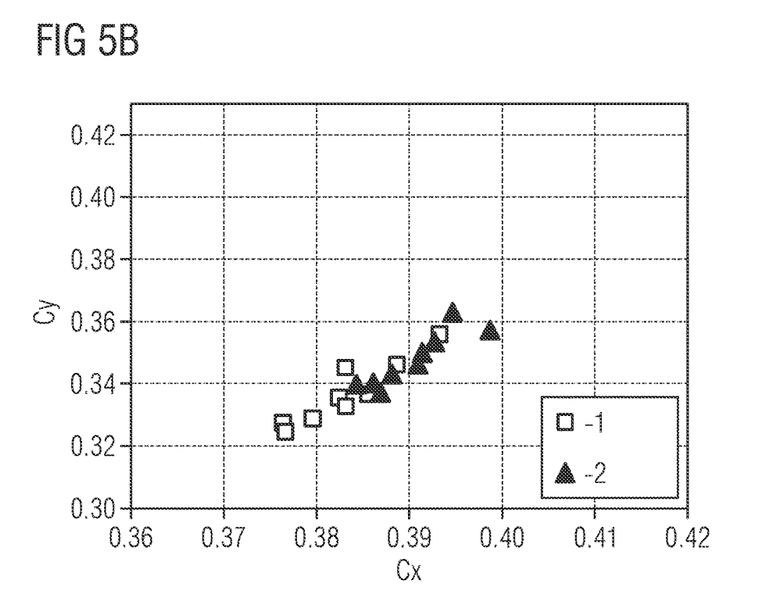
FIG. 5B shows the chromaticity diagram of an embodiment.

FIGS. 5A and 5B show an example of the embodiment.

In an optoelectronic component, for example a disc Si509 is immersed in boiling water for 30 minutes. The disc measurement results by tester before and after the boiling water test are listed in FIG. 5A. The color is plotted in FIG. 5B (rectangle, 1—sample before boiling water test; triangle, 2—sample after boiling water test).

After immersion in boiling water for 30 minutes, this embodiment color average Cx only increases 0.0069, while CE increases from 71.9 to 78.8 lm/W. This conversion element or this optoelectronic component and the matrix material 01-4102p shows more improvement in water resistance than TMS-476 and EG2760 glasses.

According to another embodiment the same 01-4102p phosphate glass powder from Tomatec, Japan is used. The weight ration of yellow-emitting phosphor to red-emitting phosphor is 4:1, and the phosphors' total weight percentage in the mixture is 35%. 0.8 g of phosphor-in-glass mixtures are sintered at 300° C. with 0 minutes under maximum pressure of 50 MPa. The sample disc S1545 is made from this phosphor glass mixture. The disc is immersed in boiling water for one hour. The disc measurement results before and after the boiling water test are listed in FIG. 6A and the color data are plotted in FIG. 6B (rectangle, 1—sample before boiling water test; triangle, 2—sample after boiling water test).

Figure 6A:
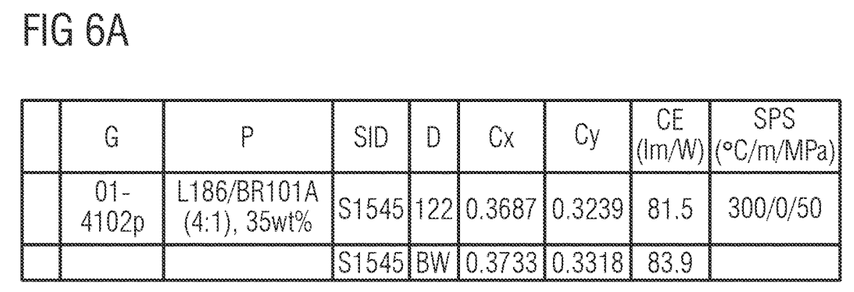
FIG. 6A shows experimental data of an embodiment.
Figure 6B:
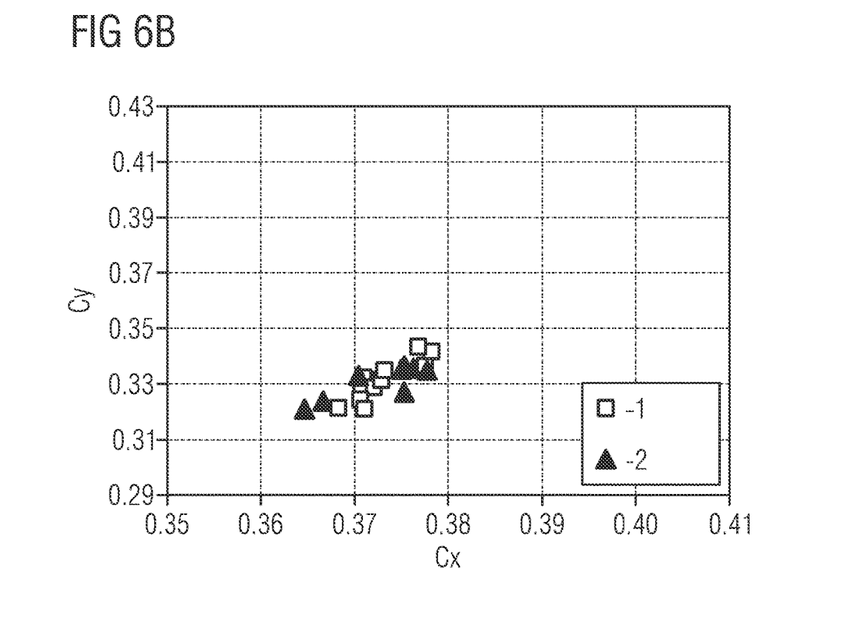
FIG. 6B shows the chromaticity diagram of an embodiment.

The disc S1545 average color only increases by 0.0046, while CE increases to 83.9 from 81.5 lm/W after a boiling water test for one hour. The results confirm the superior water resistance of 01-4102p phosphate glass. This low-melting phosphate glass can comprise the following materials or consist thereof: $P_2O_5$, $Al_2O_3$, $B_2O_3$, $Na_2O$, $K_2O$ and F.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention comprises any new feature and any novel combination of features, which includes in particular any combination of features in the patent claims, even if this feature or this combination itself is not explicitly specified in the patent claims or exemplary embodiments.

What is claimed is:

1. An optoelectronic component comprising:
   a semiconductor chip;
   a conversion element, which comprises a wavelength converting phosphor dispersed in a matrix material;
   wherein the matrix material is a low-melting phosphate glass and water resistant;
   wherein the low-melting phosphate glass comprises $P_2O_5$, $Al_2O_3$, $B_2O_3$, $Na_2O$, $K_2O$ and F; and
   wherein the optoelectronic component is configured to emit warm white light during operation, the light being emitted from the semiconductor chip and through the conversion element.

2. The optoelectronic component according to claim 1, wherein the low-melting phosphate glass has properties so that the conversion element is producible by a processing temperature below 400° C.

3. The optoelectronic component according to claim 1, wherein the conversion element comprises a red emitting phosphor and a second phosphor, the second phosphor comprising a green or yellow emitting phosphor.

4. The optoelectronic component according to claim 3, wherein the second phosphor comprises a yellow emitting phosphor selected from the group consisting of LuAG:Ce, YAG:Ce, β-SiAlON:Eu and SrSiON:Eu.

5. The optoelectronic component according to claim 3, wherein the red emitting phosphor comprises a phosphor selected from the group consisting of $CaAlSiN_3$:Eu, $(Ca, Sr, Ba)_2Si_5N_8$:Eu, α-SiAlON:Eu and $K_2SiF_6$:$Mn_4$+.

6. The optoelectronic component according to claim 1, wherein the conversion element comprises inorganic powder for adjusting a scattering property or thermal conductivity property of the conversion element.

7. The optoelectronic component according to claim 6, wherein the inorganic powder comprises a powder selected from the group consisting of $TiO_2$, $ZrO_2$, $Al_2O_3$, AlN and synthetic diamonds.

8. The optoelectronic component according to claim 1, wherein the total content of the phosphor in the conversion element is in the range of 25 to 40 wt %.

9. The optoelectronic component according to claim 1, wherein the conversion element comprises a yellow emitting phosphor and a red emitting phosphor, wherein the ratio of the yellow emitting phosphor to the red emitting phosphor is in the range of 3:1 to 5:1.

10. The optoelectronic component according to claim 1, wherein the warm white light has a correlated color temperature in the range of 1500 K to 3500 K.

11. The optoelectronic component according to claim 1, wherein the optoelectronic component has a CRI (color rendering index) of more than 90.

12. The optoelectronic component according to claim 1, wherein the warm white light emitted during operation has a wavelength range of 400 nm to 490 nm.

13. The optoelectronic component according to claim 1, wherein the conversion element is free of silicone or free of epoxy.

14. A method for producing an optoelectronic component, the method comprising:
    forming a conversion element over a main surface of a semiconductor chip;
    wherein the conversion element comprises a wavelength converting phosphor dispersed in a matrix material;
    wherein the matrix material is a low-melting phosphate glass and water resistant;
    wherein the low-melting phosphate glass comprises $P_2O_5$, $Al_2O_3$, $B_2O_3$, $Na_2O$, $K_2O$ and F; and
    wherein the optoelectronic component is configured to emit warm white light during operation, the light being emitted from the semiconductor chip and through the conversion element.

15. The method according to claim 14, wherein forming the conversion element comprises:
    providing a powdered matrix material, which is the low-melting phosphate glass and is water resistant;
    providing a powdered phosphor that able to convert radiation;
    mixing the powdered matrix material and the powdered phosphor; and
    sintering the mixture of the powdered matrix material and the powdered phosphor at a maximum processing temperature of 400° C. under reducing atmosphere.

16. A method comprising:
    providing a powdered matrix material, which is a low-melting phosphate glass and is water resistant;
    providing a powdered phosphor that able to convert radiation;
    mixing the powdered matrix material and the powdered phosphor; and
    sintering the mixture of the powdered matrix material and the powdered phosphor at a maximum processing temperature of 400° C. under reducing atmosphere.

17. The method according to claim 16, wherein the method is free of a solvent in when mixing the powdered matrix material and the powdered phosphor.

18. The method according to claim 16, wherein the sintering is performed at a maximum pressure of 50 MPa.

19. The method according to claim 16, wherein the sintering is performed at a temperature less than or equal to 300° C.

20. The method according to claim 16, wherein the low-melting phosphate glass comprises $P_2O_5$, $Al_2O_3$, $B_2O_3$, $Na_2O$, $K_2O$ and F.

* * * * *